(12) United States Patent
Chan

(10) Patent No.: US 6,291,863 B1
(45) Date of Patent: Sep. 18, 2001

(54) THIN FILM TRANSISTOR HAVING A MULTI-LAYER STACKED CHANNEL AND ITS MANUFACTURING METHOD

(75) Inventor: Ha Hyoung Chan, Kyoungki-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 08/304,368

(22) Filed: Sep. 12, 1994

Related U.S. Application Data

(62) Division of application No. 08/085,399, filed on Jun. 30, 1993, now Pat. No. 5,372,959.

(30) Foreign Application Priority Data

Jul. 1, 1992 (KR) .................................................. 92-11680

(51) Int. Cl.$^7$ .................................................. H01L 29/76
(52) U.S. Cl. .......................... 257/401; 257/66; 257/618; 257/622; 438/280; 438/284
(58) Field of Search .............................. 257/66, 401, 618, 257/622; 438/280, 284

(56) References Cited

U.S. PATENT DOCUMENTS

| | | | |
|---|---|---|---|
| 4,903,089 | * 2/1990 | Hollis et al. | 257/266 |
| 4,979,014 | * 12/1990 | Hieda et al. | 257/401 |
| 5,221,849 | 6/1993 | Goronkin et al. | 257/20 |
| 5,262,663 | * 11/1993 | Rho et al. | 257/401 |
| 5,324,960 | * 6/1994 | Pfiester et al. | 257/401 |

FOREIGN PATENT DOCUMENTS

| | | | |
|---|---|---|---|
| 60-94773 | * 5/1985 | (JP) | 257/287 |
| 62-274662 | * 11/1987 | (JP) | 257/401 |

* cited by examiner

*Primary Examiner*—Eddie Lee
(74) *Attorney, Agent, or Firm*—Popham, Haik, Schnobrich & Kaufman, Ltd.

(57) ABSTRACT

Disclosed is a thin film transistor used to manufacture a highly integrated SRAM or LCD and its manufacturing method, and more particularly, to a thin film transistor having a multi-layer stacked channel in order to increase the current flow during the thin film transistor's ON state by securing a enough channel width despite of the limited area; A thin film transistor on which a channel had been deposited in accordance with the present invention can be manufactured in a small area; accordingly, a highly integrated SRAM can be manufactured by decreasing the area of the unit cell of SRAM. Also, the resolution can be enhanced by decreasing the area occupied by the thin film transistor in the panel during the manufacturing process of the LCD.

8 Claims, 1 Drawing Sheet

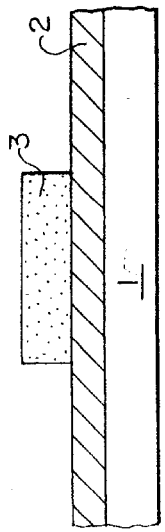
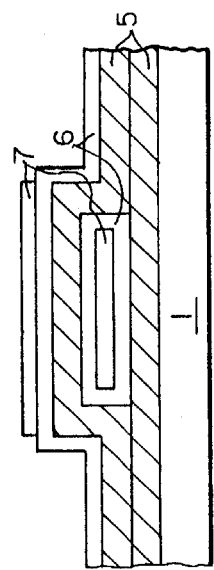
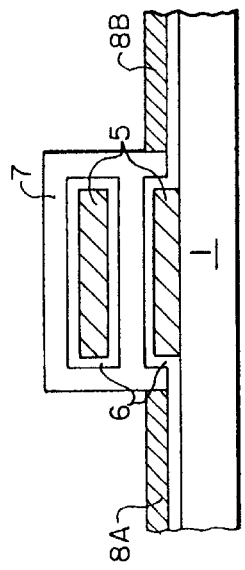
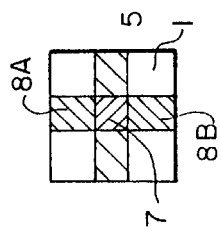
FIG. 1a
FIG. 1b
FIG. 2a
FIG. 2b
FIG. 3a
FIG. 3b
FIG. 4a
FIG. 4b
FIG. 4c

THIN FILM TRANSISTOR HAVING A MULTI-LAYER STACKED CHANNEL AND ITS MANUFACTURING METHOD This is a divisional of application Ser. No. 08/085,399, filed Jun. 30, 1993 now Pat. No. 5,372,959.

FIELD OF THE INVENTION

This invention relates to a thin film transistor used in a highly integrated Static Random Access Memory (SRAM) or Liquid Crystal Display (LCD) and its manufacturing method and more particularly, to a thin film transistor having a multi-layer stacked channel in order to increase the current flow during the transistor's ON state by securing a enough channel width despite of the limited space available.

BACKGROUND OF THE INVENTION

Generally, conventional manufacturing methods of the thin film transistor are performed as followings: first, a semiconductor thin film for channels is formed flatly; second, a thin film transistor gate insulating layer and thin film transistor gate are formed over it; and lastly, a source/drain is formed by implanting impurities onto a portion of the semiconductor thin film.

However, when applying the above mentioned thin film transistor manufacturing technique to the manufacturing of a next generation highly integrated SRAM or LCD, the unit cell area increases greatly and as a result, the device size increases. That is why the above mentioned technique is not suited for manufacturing the highly integrated SRAM. Also, during the manufacturing process of the LCD requiring a high resolution, the unit area occupied by the thin film transistor must be minimized in order to upgrade the resolution. However, this objective can not be achieved by applying the conventional manufacturing technique of thin film transistor.

SUMMARY OF THE INVENTION

In order to overcome these problems, the present invention provides a thin film transistor having multi-layer stacked channel that is capable of increasing the current flow during the transistor's ON state. Therefore, the inventive thin film transistor provides a enough channel width although it occupies minimized area.

BRIEF DESCRIPTION OF THE DRAWINGS

FIG.1 through FIG.4 are diagrams illustrating the steps of manufacturing a stacked thin film transistor of the present invention.

FIGs. 1(a) and 1(b) are a cross sectional view and a top view illustrating the forming of a second insulating layer pattern after depositing a first polysilicon layer on top of a first insulating layer.

FIGS. 2(a) and 2(b) are a cross sectional view and a top view illustrating the forming of the second polysilicon layer pattern.

FIGS. 3(a) and 3(b) are a cross sectional view and a top view illustrating the forming of a, thin film transistor gate after removing the second insulating layer pattern.

FIGS. 4(a), 4(b), and 4(c) are cross sectional views and a top view illustrating the forming of a gate insulating layer, a channel, source and drain of the thin film transistor.

DETAILED DESCRIPTION OF THE INVENTION

Now, the embodiments of the present invention will be explained in detail by referring to the accompanying drawings.

As shown in FIGS. 1(a) and 1(b), a first polysilicon layer 2 is deposited over a first insulating layer 1 and over it, a second insulating layer 3, for example silicon oxide layer, is deposited. And then, the second insulating layer 3 is patterned via a pattern processing of a lithographic technique. FIG. 1(b) which is top view of FIG. 1(a) shows that the second insulating layer pattern 3 elongates lengthwise. Upon the completion of the processes illustrated in FIG. 1, a second polysilicon layer 4 is deposited and patterned using a lithographic technique as shown in FIGS. 2(a). In the FIG. 2(b), the second polysilicon layer pattern 4 is elongated horizontally.

Next, the second insulating layer 3 is removed via a wet etching process and a tunnel between the first polysilicon layer 2 and the second polysilicon layer 4 is formed. And then, portions of the first polysilicon layer 2 not overlapped with the second polysilicon layer pattern 4 are etched out as shown in FIGS. 3(a) and 3 (b) The remaining first and second polysilicon layer pattern numbered as 5 in the figures serves as a gate of the thin film transistor.

After the processes illustrated in FIG. 3, a gate insulating layer 6 is deposited on the tunnel surface and over the thin film transistor gate 5 and then, a third polysilicon layer 7 is deposited on the surface of the gate insulating layer 6 located on the upper part of the structure and in the tunnel. The third polysilicon layer is patterned via a pattern processing of the lithographic technique to form a thin film transistor channel 7 and then, thee impurity that is different type from that of the impurity implanted into the channel area of the third polysilicon layer pattern is implanted into the part other than predetermined channel area to form a source 8A and drain 8B of the thin film transistor. FIGS. 4(a) and 4(b) illustrate the stacking of the double-layered channel 7 of the thin film transistor, FIG. 4(c) is a top view of the device shown in FIGS. 4(a) and 4(b). FIGS. 4(a) and 4(b) which are cross sectional view can be obtained by taking along the horizontal center line (not illustrated) and the lengthwise center line (not illustrated) respectively, in FIG. 4(c).

It is understood that various other modifications will be apparent to and can be readily made by those skilled in the art without departing from the scope and spirit of the invention. For example, a solid source can be used, instead of an ion-injection process, to form the source and drain of the thin film transistor. Also, the channel of thin film transistor can use, instead of a polysilicon layer, an amorphous silicon layer. Furthermore, the channel of thin film transistor can be formed on the lower part of the gate of thin film transistor instead of forming it on the upper part of the gate of thin film transistor.

As described so far, by manufacturing a thin film transistor having a multi-layer stacked channel, a enough channel width can be secured despite the limitation imposed by the small size and accordingly, the current flow during the thin film transistor's ON state can be increased. By doing so, the unit cell area of the highly integrated SRAM be decreased for higher integrity. Also, since the area occupied by the thin film transistor can be reduced during the manufacturing of LCD requiring a high resolution, a resolution higher than that of the conventional LCD can be obtained.

What is claimed is:

1. A thin film transistor comprising:
   a gate having a length and comprising a first silicon layer disposed over a second silicon layer and configured to form a tunnel therebetween;
   a gate insulating layer formed on the inner surface of the tunnel and on an upper surface of said first silicon layer of said gate;

a third silicon layer configured to form a thin film transistor channel, said third silicon layer formed on the surfaces of said gate insulating layer and tunnel and elongated across said gate length; and a source and drain formed on a part of said third silicon layer that is not overlapped with said gate.

2. The thin film transistor according to claim 1, wherein said first, second and third silicon layers are made of an amorphous silicon.

3. The thin film transistor according to claim 1, wherein said source and drain is a silicon layer implanted with a material of an impurity type different from that of a material implanted within the third silicon layer.

4. The thin film transistor according to claim 1, wherein said first, second and third silicon layers are made of polysilicon.

5. A thin film transistor comprising:

a gate made of first and second silicon layer patterns having a tunnel in the center thereof formed on a first insulating layer;

a gate oxide layer formed on the tunnel's inner surface of said gate and on top of said gate;

a third silicon layer pattern for a thin film transistor channel formed on the surface of said gate oxide layer, whereby the channel forms a double-layer in the tunnel of said gate and on top of said gate; and a source and drain formed on the part of said third silicon layer pattern that does not overlap with said gate.

6. The thin film transistor according to claim 5, wherein said first, second and third silicon layer patterns are made of a polysilicon layer.

7. The thin film transistor according to claim 5, wherein said first, second and third silicon layer patterns are made of an amorphous silicon layer.

8. The thin film transistor according to claim 5, wherein said source and drain is a silicon layer implanted with a material of a type different from an impurity material implanted within said third silicon layer pattern.

* * * * *